(12) United States Patent
Bergesch et al.

(10) Patent No.: US 8,496,307 B2
(45) Date of Patent: Jul. 30, 2013

(54) DOOR ASSEMBLY AND METHOD OF REPLACING A DOOR OF AN ELECTRONICS CABINET

(75) Inventors: Joseph H. Bergesch, Chesterfield, MO (US); Kevin Neil Thomas, Florissant, MO (US); Mark A. Uhrhan, Columbia, IL (US)

(73) Assignee: Schneider Electric IT Corporation, West Kingston, RI (US)

( * ) Notice: Subject to any disclaimer, the term of this patent is extended or adjusted under 35 U.S.C. 154(b) by 45 days.

(21) Appl. No.: 13/461,349

(22) Filed: May 1, 2012

(65) Prior Publication Data

US 2012/0227330 A1    Sep. 13, 2012

Related U.S. Application Data

(62) Division of application No. 12/411,693, filed on Mar. 26, 2009, now Pat. No. 8,167,386.

(51) Int. Cl.
| | |
|---|---|
| *A47B 97/00* | (2006.01) |
| *E05B 65/46* | (2006.01) |
| *E05B 53/00* | (2006.01) |
| *E05C 7/06* | (2006.01) |
| *E05C 1/00* | (2006.01) |

(52) U.S. Cl.
USPC ........... 312/352; 312/215; 312/218; 312/222; 292/32; 292/DIG. 51

(58) Field of Classification Search
USPC ................. 312/215–219, 222, 324, 326, 329, 312/109, 223.2; 49/394, 395, 366, 367; 292/32–34, 37–38, 42, 137–138, 140–141, 292/145, DIG. 51, DIG. 11
See application file for complete search history.

(56) References Cited

U.S. PATENT DOCUMENTS

| | | | | |
|---|---|---|---|---|
| 1,450,180 | A * | 4/1923 | Jamison | 312/249.8 |
| 1,603,404 | A | 10/1926 | Proctor | |
| 1,919,328 | A | 7/1933 | Hansen | |
| 3,023,068 | A * | 2/1962 | Haag | 312/263 |
| 3,953,061 | A | 4/1976 | Hansen et al. | |
| 4,073,554 | A * | 2/1978 | Oder et al. | 312/199 |
| 4,265,051 | A | 5/1981 | Williams | |
| 4,289,363 | A * | 9/1981 | Andersson et al. | 312/257.1 |
| 4,477,130 | A | 10/1984 | Frantz | |
| 4,836,626 | A | 6/1989 | Taylor et al. | |
| 4,854,653 | A * | 8/1989 | Lakso | 312/222 |
| 5,172,970 | A * | 12/1992 | Momose et al. | 312/329 |
| 5,290,077 | A | 3/1994 | Fleming | |
| 5,524,942 | A | 6/1996 | Fleming | |
| 5,568,362 | A | 10/1996 | Hansson | |
| 5,603,184 | A | 2/1997 | Campbell et al. | |
| 5,782,507 | A | 7/1998 | Hardee | |
| 5,944,397 | A * | 8/1999 | Zeitler | 312/220 |
| 5,974,745 | A * | 11/1999 | Barr | 52/212 |
| 6,176,041 | B1 | 1/2001 | Roberts | |
| 6,247,641 | B1 * | 6/2001 | Noblet et al. | 232/17 |
| 6,282,929 | B1 * | 9/2001 | Eller et al. | 70/109 |
| 6,328,205 | B1 * | 12/2001 | Noblet et al. | 232/17 |

(Continued)

*Primary Examiner* — David Dunn
*Assistant Examiner* — Ryan A Doyle
(74) *Attorney, Agent, or Firm* — Lando & Anastasi, LLP

(57) ABSTRACT

Disclosed are rack enclosures for electronic equipment including at least one door configured to define a space between an edge of the door and a wall or frame of the cabinet, kits for retrofitting rack enclosures to include such a door, and methods of installing such.

17 Claims, 16 Drawing Sheets

U.S. PATENT DOCUMENTS

| | | |
|---|---|---|
| 6,357,268 B1 | 3/2002 | Takimoto |
| 6,422,612 B1* | 7/2002 | Hays et al. .................. 292/5 |
| 6,668,565 B1 | 12/2003 | Johnson et al. |
| 6,708,625 B1* | 3/2004 | Burke et al. ................ 105/355 |
| 6,746,092 B2 | 6/2004 | Leccia et al. |
| 7,001,001 B1 | 2/2006 | Spencer |
| 7,275,770 B2 | 10/2007 | Guebre-Tsadik et al. |
| 7,293,666 B2 | 11/2007 | Mattlin et al. |
| 7,828,399 B1 | 11/2010 | Bass |
| 7,896,177 B1* | 3/2011 | Toma ........................ 211/182 |
| 2002/0095960 A1 | 7/2002 | Grover |
| 2003/0151337 A1* | 8/2003 | Leccia et al. ................ 312/326 |
| 2004/0216852 A1* | 11/2004 | Woodward et al. ............ 160/92 |
| 2005/0253489 A1* | 11/2005 | Heyer ........................ 312/245 |
| 2006/0006773 A1 | 1/2006 | Guebre-Tsadik et al. |
| 2006/0151588 A1* | 7/2006 | Mikolajczyk et al. .......... 232/24 |
| 2006/0261712 A1 | 11/2006 | Henriott et al. |
| 2007/0080541 A1 | 4/2007 | Fleming |
| 2008/0087052 A1* | 4/2008 | Abdollahzadeh et al. ........ 70/93 |
| 2008/0148642 A1 | 6/2008 | Mathieu |
| 2008/0174217 A1 | 7/2008 | Walker |
| 2008/0184749 A1 | 8/2008 | Alber et al. |
| 2009/0102332 A1* | 4/2009 | Lear ........................ 312/218 |
| 2009/0278426 A1* | 11/2009 | Vinke ........................ 312/215 |
| 2011/0144868 A1* | 6/2011 | Tezak et al. .................. 701/49 |

* cited by examiner

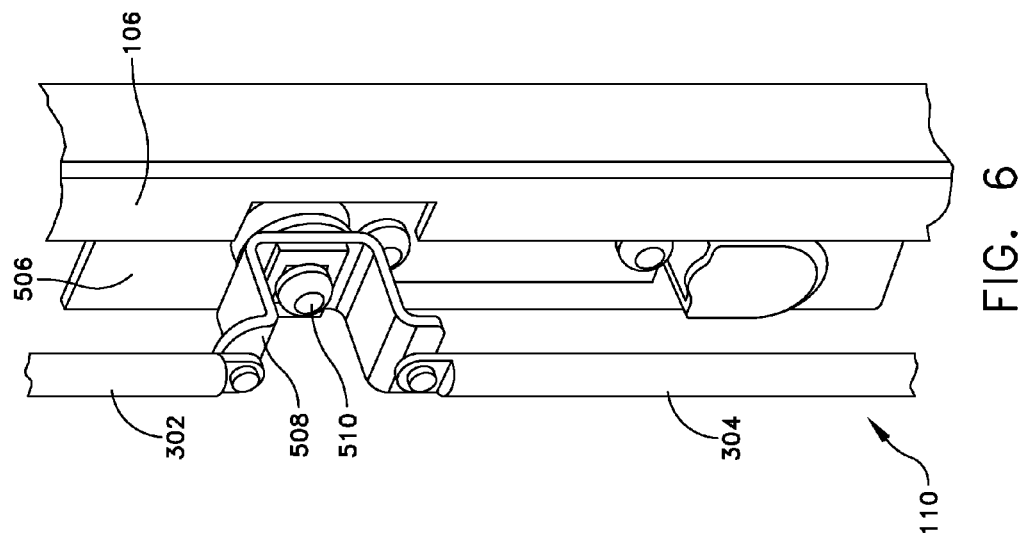
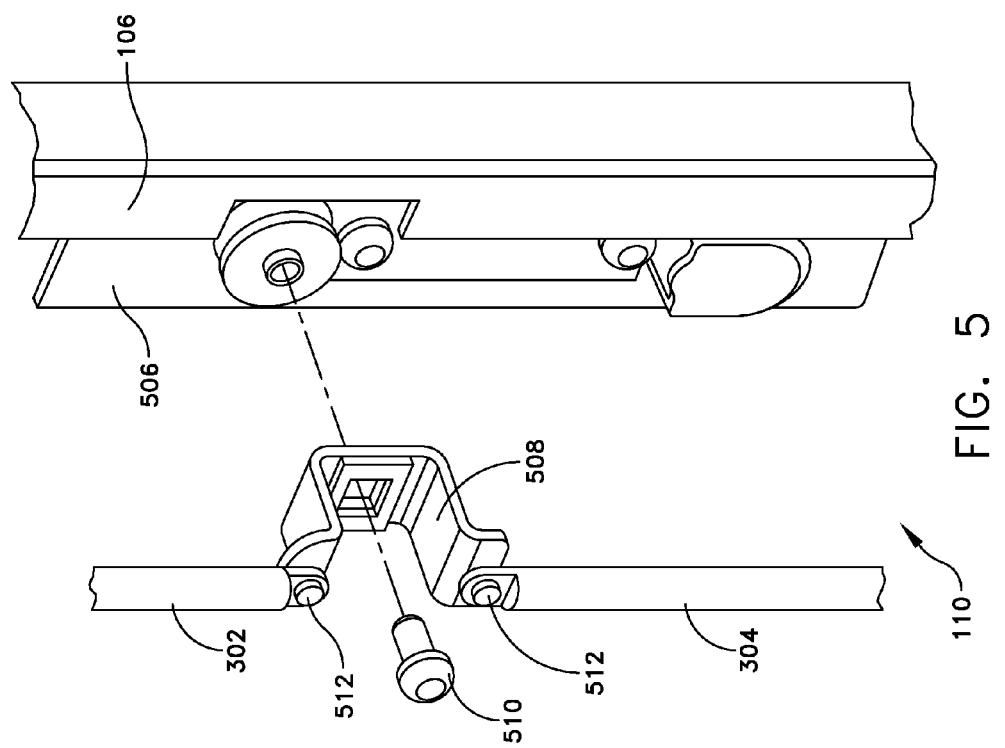
FIG. 5
FIG. 6

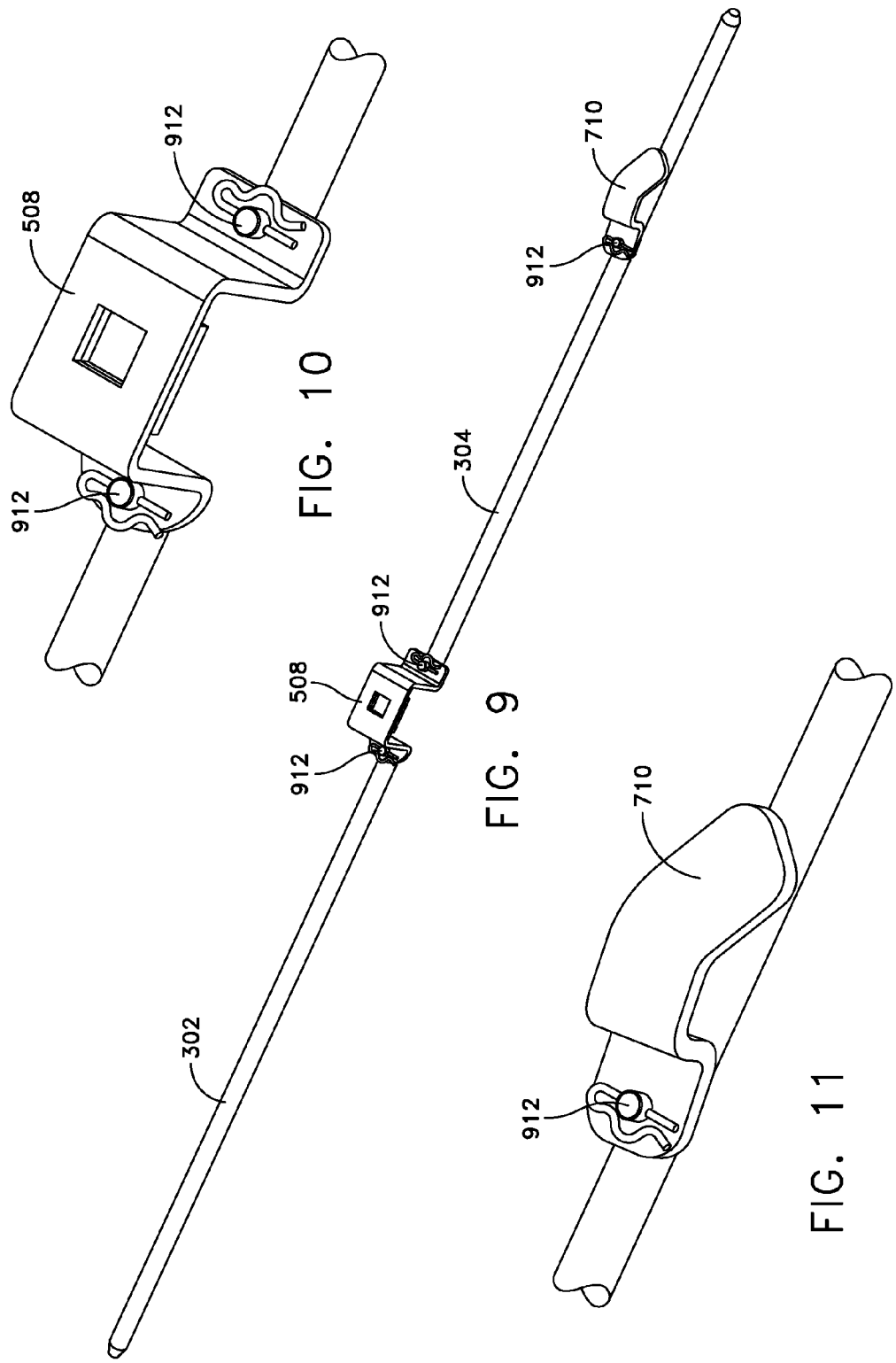

DOOR ASSEMBLY AND METHOD OF REPLACING A DOOR OF AN ELECTRONICS CABINET

RELATED APPLICATIONS

This application claims the benefit under 35 U.S.C. §120 of U.S. application Ser. No. 12/411,693, titled "DOOR ASSEMBLY AND METHOD OF REPLACING A DOOR OF AN ELECTRONICS CABINET," filed on Mar. 26, 2009, now U.S. Pat. No. 8,167,386, which is herein incorporated by reference in its entirety.

BACKGROUND OF DISCLOSURE

1. Field of Disclosure

Embodiments of the present disclosure are directed generally to door assemblies for electronic component storage cabinets.

2. Discussion of Related Art

Equipment enclosures for electronic equipment, such as data processing, networking, and telecommunications equipment, have been in use for years. A number of different standards have been developed to enable equipment manufacturers to design rack mountable equipment that can be mounted in standard racks manufactured by different manufacturers. One such standard is the Electronic Industries Alliance's EIA-310-D standard which defines parameters for what has become an industry standard nineteen inch equipment rack.

Nineteen inch equipment racks are used extensively in data centers and other facilities. With the proliferation of the Internet, it is not uncommon for a data center to contain hundreds of these equipment racks. In certain situations, it may be desirable to replace one of the front and/or rear doors of an equipment rack with a "short door" to enable cables and wires to enter and egress from the equipment rack through the space provided under and/or above the short door. One challenge to replacing a standard length door with a short door is being able to adequately secure the doors since the short door is not positively secured to a frame of the equipment rack at the bottom and/or top of the short door.

SUMMARY OF DISCLOSURE

In accordance with one embodiment of the present disclosure, there is provided a rack enclosure. The rack enclosure comprises a frame configured to define an interior suitable for supporting electronic equipment, the frame having at least one opening to allow access into the interior, a first door and a second door, the first and second doors being individually movable between an open position to allow access to the interior through the at least one opening and a closed position to block access to the interior, the second door having a height substantially coextensive with a height of the frame and the first door having a height less than the height of the frame, wherein a space is defined between at least a portion of the first door and the frame when the first door is closed, a latch assembly secured to the second door, the latch assembly including a handle coupled to the second door, a detent member coupled to the handle, the detent member being movable from a first position to a second position upon actuation of the handle, and a bracket secured to an inside surface of the first door proximate to the portion of the first door defining the space between the first door and the frame when the first door is closed, the bracket having an opening formed therein configured to receive the detent member when the detent member is moved by the handle to its second position when the first and second doors are in their closed positions.

In accordance with another embodiment of the present disclosure there is provided a rack enclosure. The rack enclosure comprises a frame configured to define an interior suitable for supporting electronic equipment, the frame having at least one opening to allow access into the interior, a first door and a second door, the first door being hingedly secured to the frame on one side of the at least one opening and the second door being hingedly secured to the frame on an other side of the at least one opening, the first and second doors being individually movable between an open position to allow access to the interior and a closed position to block access to the interior, the second door having a height substantially coextensive with a height of the frame and the first door having a height less than the height of the frame, wherein a space is defined between at least a portion of the first door and the frame when the first door is closed, a latch assembly secured to the second door, the latch assembly including a handle coupled to the second door, a detent member coupled to the handle, the detent member being movable from a retracted position to an extended position proximate an inside surface of the first door when the doors are in their closed positions and the handle is actuated, and a bracket secured to an inside surface of the second door proximate to the portion of the first door defining the space between the first door and the frame when the first door is closed.

In accordance with another embodiment of the present disclosure there is provided a retrofit kit for a rack enclosure of the type comprising a frame configured to define an interior suitable for supporting electronic equipment, the frame having at least one opening to allow access into the interior, a first door, a second door, the first door being hingedly secured to the frame on one side of the at least one opening and the second door being hingedly secured to the frame on an other side of the at least one opening, the first and second doors being individually movable between an open position to allow access to the interior and a closed position to block access to the interior, the first door having a height less than a height of the second door, and a latch assembly secured to the second door, the latch assembly including a handle rotatably coupled to the second door between an open position and a locked position, a first shaft portion coupled to the handle, and a second shaft portion coupled to the handle, the first and second shaft portions being configured to engage the frame when the first and second doors are in their closed positions and the handle is rotated to its locked position, the first door including a flange configured to overlap an edge of the second door when the first and second doors are in their closed positions. The retrofit kit comprises a detent member constructed and arranged to couple to the handle, the detent member constructed and arranged to be movable from a retracted position to an extended position when rotating the handle from its open position to its locked position, and a bracket constructed and arranged to be secured to the first door, the bracket having an opening formed therein arranged to receive the detent member when the detent member is moved by the handle to its extended position when the first and second doors are in their closed positions.

In accordance with another embodiment of the present disclosure there is provided a retrofit kit for doors of an electronics cabinet. The retrofit kit comprises a latch assembly including one or more lock rods, a center lock rod mounting bracket, a fastener constructed and arranged to couple at least one of the one or more lock rods to the center lock rod mounting bracket, a detent member constructed and arranged to rotatably attach to one of the one or more lock rods, one or more brackets constructed and arranged to secure the latch assembly to at least one of the one or more doors, and one or more bushings constructed and arranged to couple to the one or more brackets and to guide the one or more lock rods, a handle constructed and arranged to couple to the latch assembly, and instructions for installing the retrofit kit.

In accordance with a further embodiment of the present disclosure there is provided a method of replacing a door of an electronics cabinet. The method comprises providing a first door having a height less than a height of a frame of the electronics cabinet, attaching the first door to the frame of the cabinet, and installing a latch assembly on a second door, the latch assembly including one or more lock rods and a detent member configured to selectively engage the first door.

In accordance with another embodiment of the present disclosure, there is provided a rack enclosure. The rack enclosure comprises a frame configured to define an interior suitable for supporting electronic equipment, the frame having at least one opening to allow access into the interior, a first door and a second door, the first and second doors being individually movable between an open position to allow access to the interior through the at least one opening and a closed position to block access to the interior, the second door having a height substantially coextensive with a height of the frame and the first door having a height less than the height of the frame, wherein a space is defined between at least a portion of the first door and the frame when the first door is closed, a latch assembly secured to the second door, the latch assembly including a handle coupled to the second door, a detent member coupled to the handle, the detent member being movable from a first position to a second position upon actuation of the handle, a slot formed in the first door proximate to the portion of the first door defining the space between the first door and the frame when the first door is closed, the slot configured to receive the detent member when the detent member is moved by the handle to its second position when the first and second doors are in their closed positions.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings:

FIG. 5 is an exploded perspective view of a center lock rod retaining bracket and door assembly according to an embodiment of the present disclosure;

FIG. 6 is a perspective view of the center lock rod retaining bracket and door assembly shown in FIG. 5;

FIG. 9 is a perspective rear view of a lock rod assembly according to an embodiment of the present disclosure;

FIG. 10 is an enlarged perspective rear view of the center lock rod retaining bracket assembly shown in FIG. 9;

FIG. 11 is an enlarged perspective view of a detent member assembly shown in FIG. 9;

DETAILED DESCRIPTION

Figure 1:
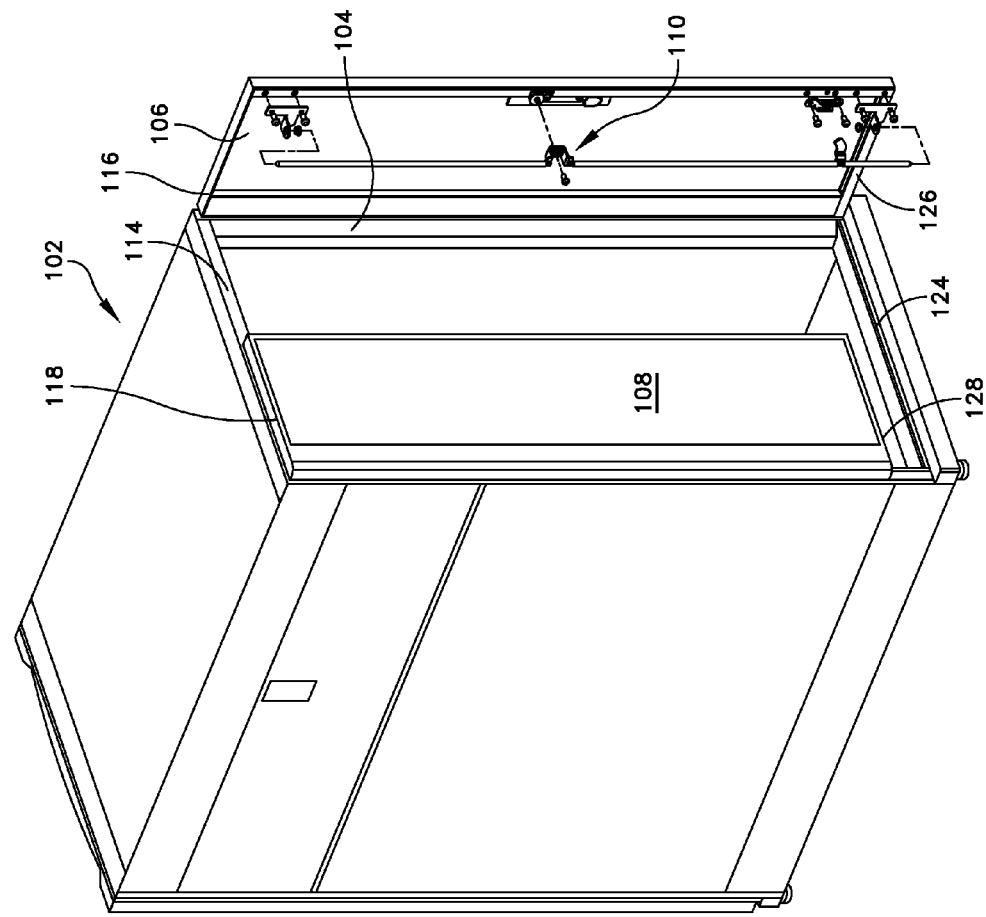
FIG. 1 is a perspective view of an electronics cabinet according to an embodiment of the present disclosure.

This disclosure is not limited in its application to the details of construction and the arrangement of components set forth in the following description or illustrated in the drawings. The disclosure is capable of other embodiments and of being practiced or of being carried out in various ways. Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

In accordance with an embodiment of the present disclosure, there is provided an electronics cabinet having a pair of rear doors. It should be understood that any reference to "equipment rack," "rack enclosure," and/or "electronics cabinet," or any variation thereof, e.g. "equipment cabinet" or "cabinet," are used interchangeably herein and are meant to describe a structure suitable for supporting and organizing electronic equipment. Also, although the present disclosure describes doors of a cabinet as being rear doors, is should be understood that this disclosure would apply equally well to doors on the front, side, top, or any other part of a cabinet.

The rear doors are mounted by hinges to the sides of the rear of the electronics cabinet. The rear doors may be closed by swinging toward the rear of the electronics cabinet causing at least a portion of the peripheries of the doors to come into contact with a rear frame of the electronics cabinet. One of the doors (a "first" door) has a flange extending from at least a portion of an internal surface at an edge opposite that of the edge at which it is attached to the electronics cabinet. The other door (a "second" door) is configured to close and trap the flange of the first door against an internal surface of the edge of the second. In this manner, closing the first door and then closing the second door results in the first door being trapped and closed against the frame of the electronics cabinet by the second door. Locking of the second door against the frame of the electronics cabinet thus prevents either door from opening outward from the fame of the electronics cabinet. A lock mechanism is provided on the second door which includes a handle protruding from an external surface of the second door and a pair of lock rods mechanically coupled to the handle and mounted to the inside surface of the second door. Turning of the handle results in one of the lock rods extending upward and into a hole and/or recess in the frame of the electronics cabinet and/or into a bracket attached to the inside of the electronics cabinet, while the other lock rod extends downward and into a recess in the frame of the electronics cabinet and/or into a bracket attached to the inside of the electronics cabinet, thus preventing movement of the second door with respect to the door frame.

In situations in which the first door is replaced with a short door, the first door has a height less than that of the second door. At least a bottom edge or a top edge of the first door thus does not abut the frame of the electronics cabinet when closed. This leaves an open space between the bottom edge, for example, of the first door and the frame of the cabinet. This open space may be used to pass cables and/or electrical wires into and out of the cabinet to connect electronic component(s) within the cabinet to, for example, source(s) of power and/or electronic component(s) and/or communication network(s) external to the cabinet. The first door will be prevented from swinging open from a closed position when both the first and second doors are closed and locked due to the second door trapping a flange of the first door as described above. However, an edge of the first door that does not abut the frame of the cabinet may be pushed inward or outward and bent or otherwise damaged, by accident or otherwise, unless somehow secured. In accordance with an embodiment of the present disclosure a detent member is coupled to an inside surface of the second door. This detent member is extendable such that it may extend from a first position wherein it resides behind an inside surface of the second door to a second position wherein the detent member is inserted into a recess provided in a bracket coupled to the inside surface of the first door proximate an edge of the first door which does not abut the cabinet frame. The detent member secures the bracket, and by extension the first door, in place, thus preventing the first door from moving inward and/or outward under an applied force. In other embodiments, the detent member extends against an inner surface and/or a plate mounted on the inner surface of the first door, or into a slot formed in the first door, but does not engage any bracket on the first door. In some embodiments, a slot for retaining the detent member may be formed in the body of the first door, for example is a side edge of the first door. In other embodiments the slot may be formed in a member or a protrusion, such as a metal tab, mechanically coupled to a surface, for example, an inside surface, of the first door. The member may alternatively be formed of any other suitable material, for example, plastic or ceramic.

Various aspects and alternative embodiments of the present disclosure will be now described with reference to the attached figures.

In FIG. 1 there is illustrated a rear view of an electronics cabinet generally indicated at 102. The electronics cabinet is constructed and arranged for storing electronic components such as data processing, networking, and telecommunications equipment. The electronics cabinet 102 has a frame 104 to which are attached two swinging doors 106 and 108. The doors 106, 108 are attached on outer side edges to frame 104 by hinges (not shown), although other means of attachment may be used in alternate embodiments. For example the doors 106, 108 may in some embodiments be sliding doors, segmented sliding doors such as may be found on a rolltop desk or a tambour desk, or pocket doors. The doors 106, 108 may in some embodiments include holes such as ventilation holes. Also, although illustrated as having planar rectangular surfaces in FIG. 1, doors 106, 108 may in alternate embodiments have curved surfaces and/or shapes other than rectangular, such as trapezoidal or oval. The door 106 has a height substantially coextensive with a height of the frame 104, such that when closed against the frame, no vertical space exists between either the upper edge 116 of the door 106 and the upper portion 114 of the frame 104 or between the lower edge 126 of the door 106 and the lower portion 124 of the frame 104. The arrangement is such that when in a shut position, an upper edge 116 of door 106 will rest against an upper portion 114 of the frame 104 and a bottom edge 126 of door 106 will rest against a bottom portion 124 of the frame 104. In contrast, door 108 has a height less than the height of the frame 104. An upper edge 118 of the door 108 rests against the upper portion 114 of the frame 104 when the door 108 is in a closed position; however, a bottom edge 128 of the door 108 does not rest against the bottom portion 124 of the frame 104. Thus, a vertical space is provided between the bottom edge 128 of the door 108 and the bottom portion 124 of the frame 104. As described above, this space may be suitable for allowing cables and wiring to enter and exit the interior of the cabinet 102.

In some alternate embodiments, the door 108 is mounted on the frame 104 such that a vertical space exists between the upper edge 118 of the door 108 and the upper portion 114 of the frame 104. In other alternate embodiments, the door 108 is mounted on the frame 104 in a manner such that a vertical space exists both between the bottom edge 128 of the door 108 and the bottom portion 124 of the frame 104 and between the upper edge 118 of the door 108 and the upper portion 114 of the frame 104. In alternate embodiments, the doors 106 and 108 are mounted on opposite sides of the frame 104 from what is illustrated in FIG. 1 in such a manner that the door 106 is the short door and the door 108 is of standard size. In further embodiments, the doors 106 and 108 are mounted to the upper and bottom portions 114 and 124 of the frame 104 such that one door opens by swinging upward and the other opens by swinging downward. In such embodiments, a horizontal space would be left between at least one door and at least one side of the frame 104. Further embodiments include only a single door mounted to the frame 104 with at least a portion of the door having a height less than the height of the frame 104, and other embodiments include two doors, both with at least a portion having a height less than the height of the frame 104. In further embodiments, a single door is mounted to the frame 104 and opens by swinging downward, or in other embodiments, upward. At least a portion of this door would not abut the frame, thus leaving a vertical space between a portion of the door and the frame. In even further embodiments, the doors 106 and 108 are both of equal heights, but the frame 104 has one or more portions which differ in height so as to leave at least one vertical space between an upper and/or a lower edge of one or both of the doors. In a complimentary further embodiment, the cabinet includes a single door with a constant height across its width but with a frame to which the door is mounted which varies in height so as to leave at least one vertical space between the frame and an upper and/or lower edge of the door.

Also shown in FIG. 1 is a locking rod assembly, which is generally indicated at 110. This assembly is mounted on the internal surface of the door 106. The locking rod assembly 110 is illustrated as including an upper lock rod and a lower lock rod; however, in some embodiments, either one of these lock rods may be eliminated. In other embodiments, additional or different lock rods may be employed, such as lock rods that extend horizontally or at an angle, rather than vertically. The locking rod assembly 110 is shown and described in greater detail below.

Figure 2:
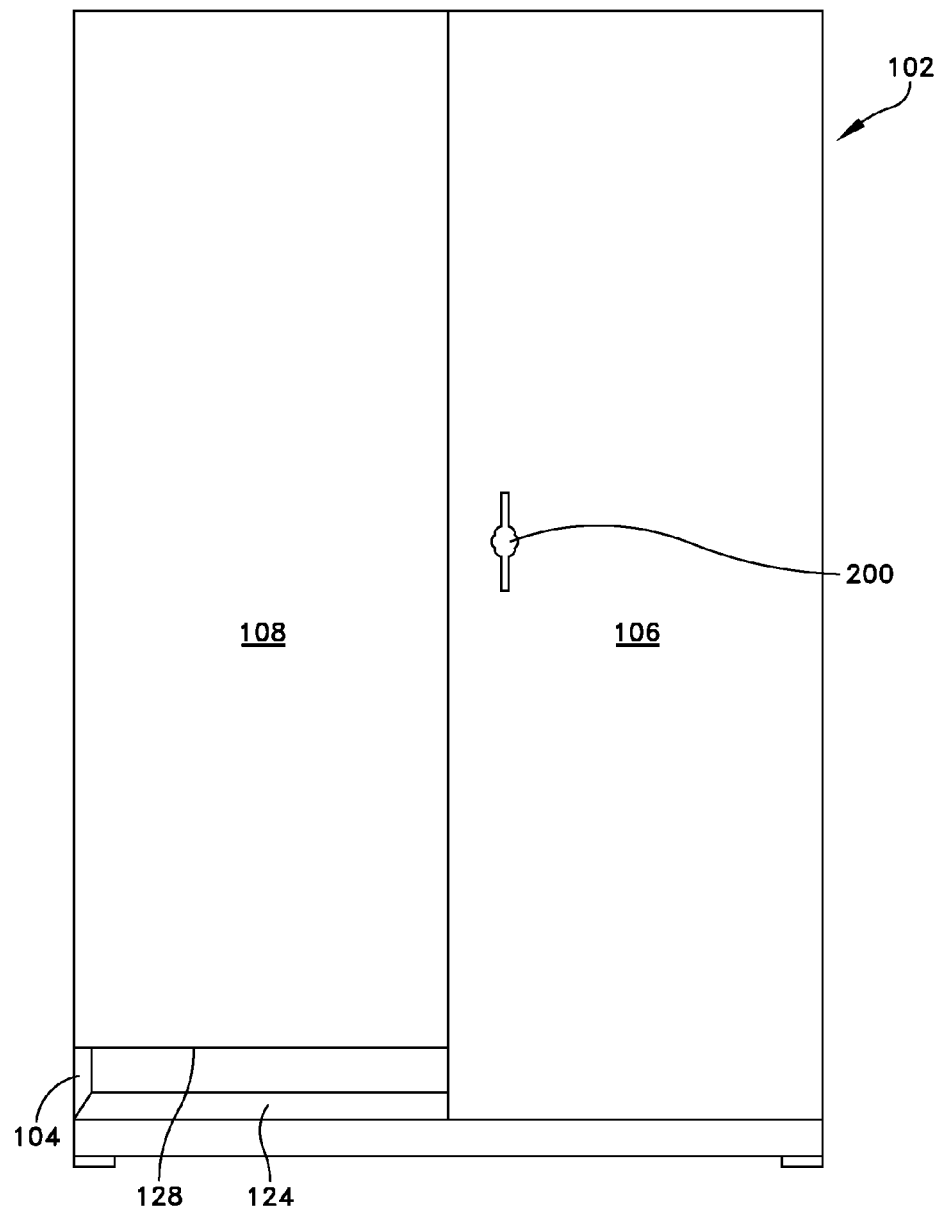
FIG. 2 is a rear view of the electronics cabinet shown in FIG. 1.

Illustrated in FIG. 2 is a rear view of the cabinet 102 of FIG. 1 with the doors 106 and 108 in a closed position. As can be seen, a vertical space exists between the bottom edge 128 of the door 108 and the bottom portion 124 of the frame 104. Also illustrated in FIG. 2 is a handle 200 which may be mechanically coupled to the locking rod assembly 110. The handle 200 may be turned to either lock or unlock the cabinet doors 106, 108. In some embodiments, the handle 200 may be locked and unlocked by the use of a mechanical key or by some other mechanism, such as by an electrically operated solenoid. In some embodiments, locking of the handle may be accomplished remotely, such as by a communications network electrically coupled to an activator, such as an electrical solenoid. The shape of the handle 200 is not intended to be limited to the shape illustrated in FIG. 2. Other shapes and designs for the handle 200 may be present in alternate embodiments. For example, the handle 200 may in some embodiments be in the form of a wheel, a disk, or a lever.

Figure 4:
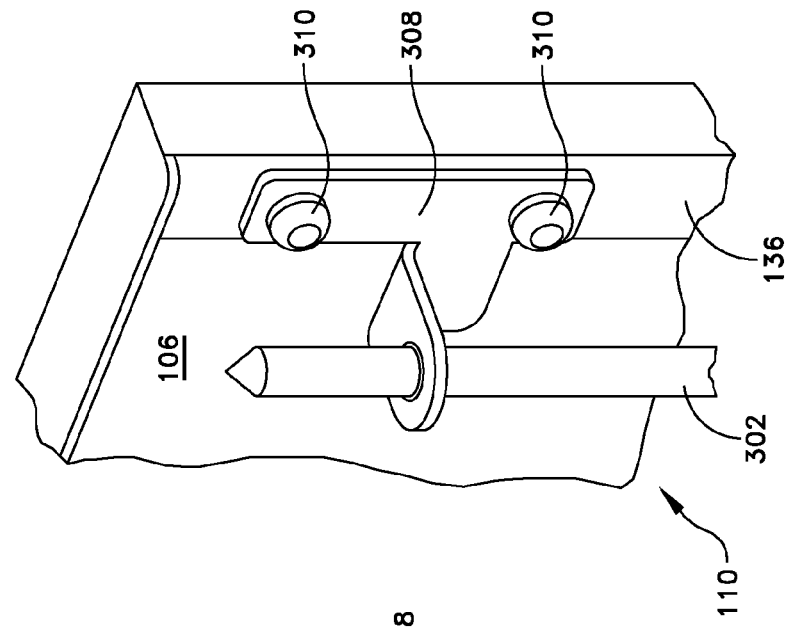
FIG. 4 is a perspective view of the upper door and lock rod assembly shown in FIG. 3.
Figure 3:
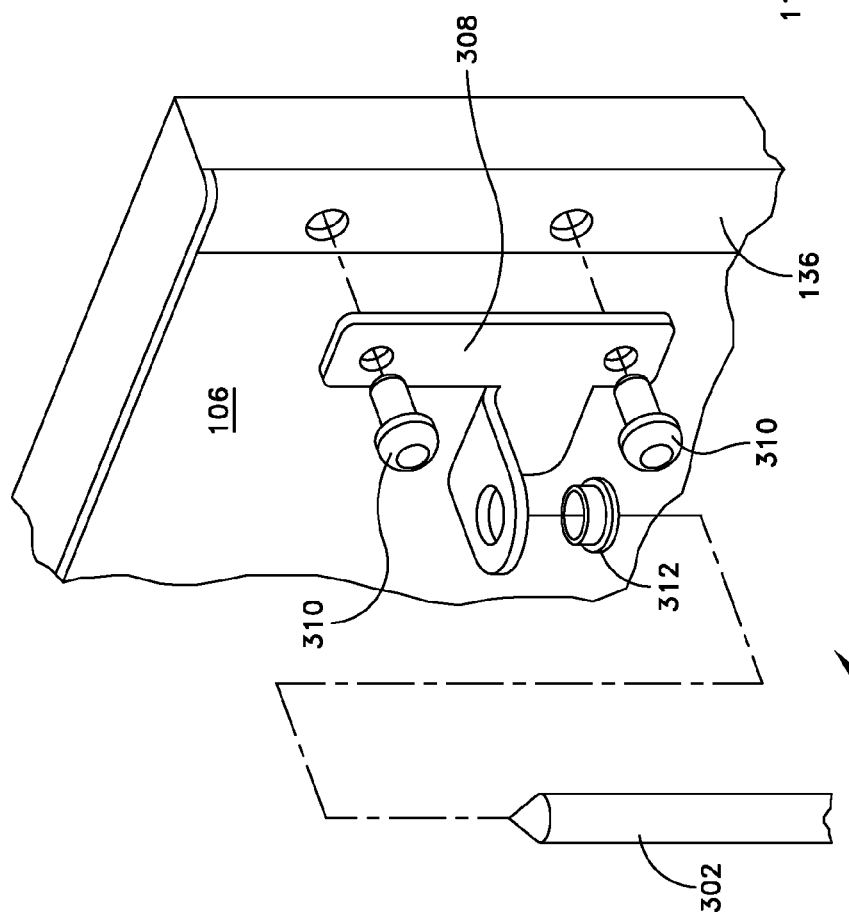
FIG. 3 is an exploded perspective view of an upper door and lock rod assembly according to an embodiment of the present disclosure.

Illustrated in FIGS. 3 and 4 is an embodiment of an upper portion of the lock rod assembly 110 of FIG. 1. FIG. 3 illustrates this portion of the lock rod assembly 110 in an exploded view and FIG. 4 illustrates this portion of the lock rod assembly 110 attached to an inner surface 136 of the door 106. In some aspects, the surface 136 corresponds to a frame member of the door 106 of FIG. 1. The lock rod assembly 110 includes an upper lock rod 302. In some embodiments, the lock rod 302 has a substantially circular cross section as shown in FIG. 2; however, in alternate embodiments, the lock rod 302 may have a rectangular cross section, and in further embodiments the lock rod 302 may have other cross sections, such as an oval cross section. In some embodiments, the lock rod 302 may be in the form of a flat bar, rather than a rod. In some embodiments, the shape and area of the cross section of the upper lock rod 302 varies along its length. The upper lock rod 302 is in some embodiments tapered on its upper end as illustrated, but in other embodiments terminates in a flat or rounded surface. Similar alternate embodiments are also possible for lower lock rods, which are discussed below. The upper portion of the upper lock rod 302 is coupled to the door 106 by a bracket 308, which is secured to the door 106 by fasteners 310. The fasteners 310 are in some embodiments screws, but in other embodiments may be rivets, bolts, or other appropriate fasteners. In some embodiments, the bracket 308 may be welded to the door or attached by an adhesive, such as epoxy. The upper portion of the upper lock rod 302 passes through a bushing 312 disposed within a hole in the bracket 308. The bushing and bracket assembly guides the upper lock rod 302 and allows the upper lock rod 302 to move vertically with respect to the bracket 308. When significantly upwardly extended, the upper lock rod 302 enters a recess and/or hole in a frame, such as the frame 104 of FIG. 1, to which the door 106 is mounted, thus retaining the door 106 against the frame when the door 106 is closed. In some embodiments, this recess and/or hole may be disposed in a bracket attached to the frame. A lower lock rod 304 operates in a similar manner as the upper lock rod 302 as is explained in further detail below. The upper lock rod 302 is also positionable into a lower position where it does not extend beyond the upper extremity of the door 106 to facilitate the opening and closing of the door 106 against the frame 104 of the cabinet 102.

Illustrated in FIGS. 5 and 6 is a lower portion of the upper lock rod 302 of the lock rod assembly 110. Also illustrated is an upper portion of the lower lock rod 304. Lock rods 302 and 304 are coupled to a center lock rod mounting bracket 508 by fasteners 512 which allow the lock rods to rotate in a plane of the surfaces of the center lock rod mounting bracket 508 to which they are attached about axes defined by fasteners 512. The lock rod mounting bracket 508 is connected to the door 106 by means of a fastener 510, which in various embodiments may be a screw, a bolt, a rivet, or any other appropriate fastener. The fastener 510 passes through an opening in the door 106 and is coupled to the handle 200 mounted on an outside surface of the door 106 shown in FIG. 2. In other aspects, a rod, screw or other form of fastener may extend from the handle 200 through the door 106 and lock rod mounting bracket 508 to be secured against the lock rod mounting bracket 508 by a pin, a washer and/or nut, or other appropriate form of fastener or fastening mechanism. Turning of the handle 200 results in a rotation of the center lock rod mounting bracket 508 and movement of the lock rods 302 and 304 in vertical, or in some embodiments horizontal or other directions.

In other embodiments, the lock rods 302, 304 may be coupled to the handle 200 by means of a gear assembly. In such embodiments, upon turning of the handle, a gear coupled to the handle 200 would turn one or more gears to which one or more of the lock rods 302, 304 are coupled. This would result in the one or more lock rods 302, 304 moving in response to the turning of the handle 200.

Figure 7:
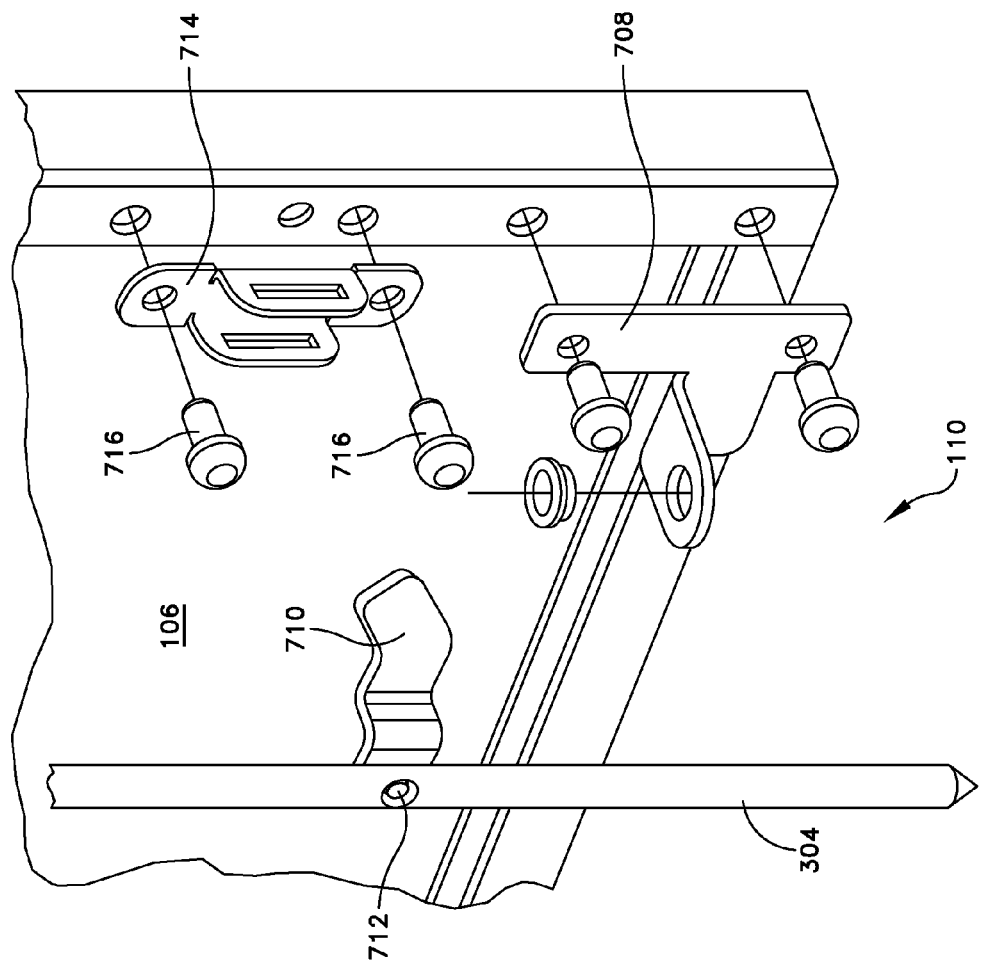
FIG. 7 is an exploded perspective view of a lower door and lock rod assembly according to an embodiment of the present disclosure.
Figure 8:
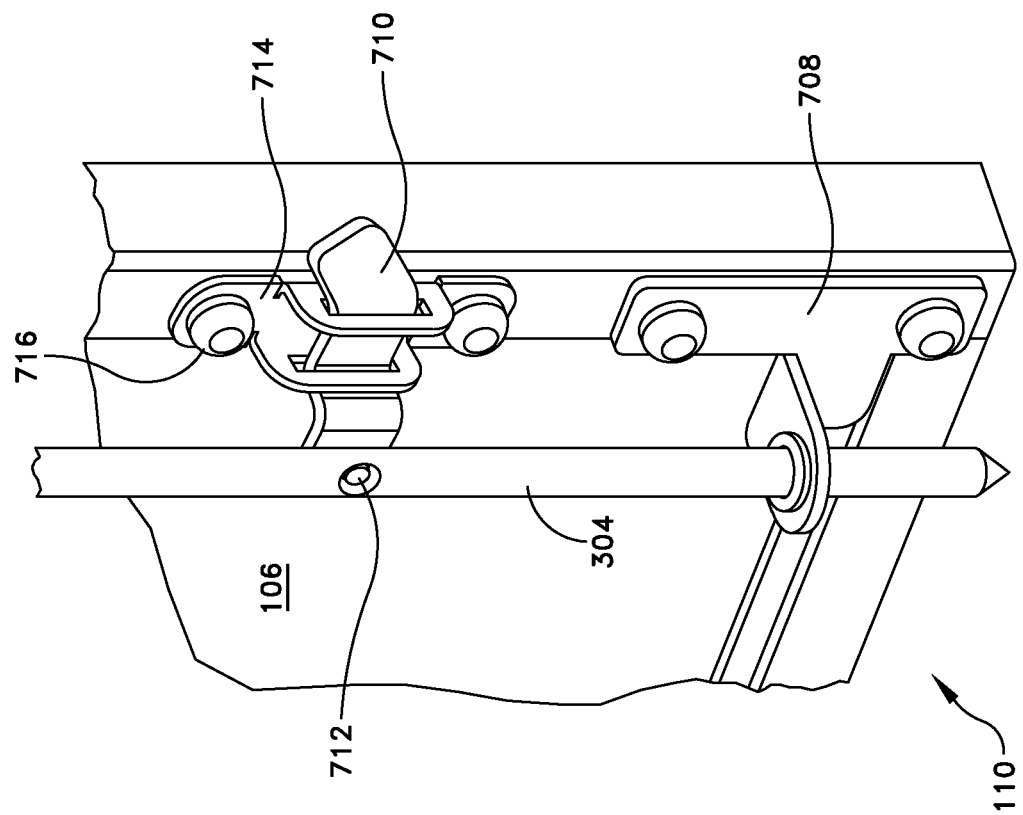
FIG. 8 is a perspective view of the lower door and lock rod assembly shown in FIG. 7.
Figure 12:
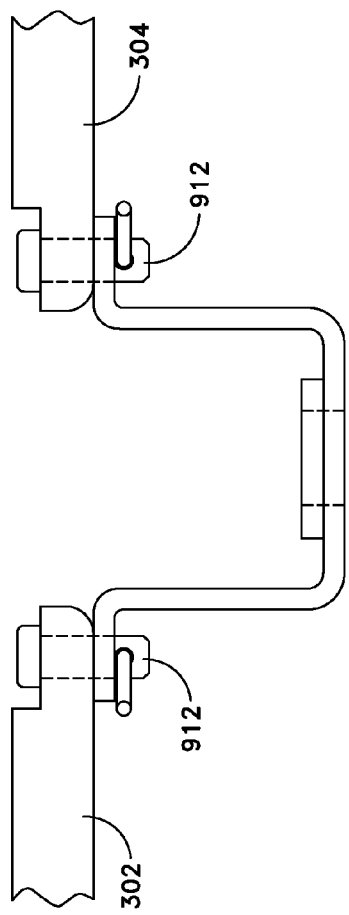
FIG. 12 is a side view of the center lock rod retaining bracket assembly shown in FIG. 9.
Figure 13:
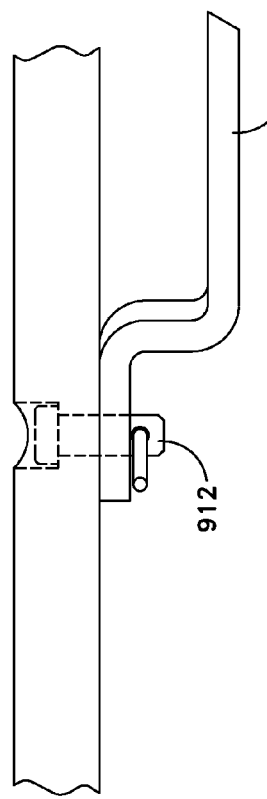
FIG. 13 is a side view of the detent member assembly shown in FIG. 9.

Illustrated in FIGS. 7 and 8 is a lower portion of the lower lock rod 304 of the lock rod assembly 110. The lower lock rod 304 is secured to an inside surface of the door 106 by a bracket 708, which in some embodiments is similar in structure and function to the bracket 308 illustrated in FIGS. 3 and 4. The fasteners and bushing illustrated in FIGS. 7 and 8 may also be similar in structure and function to those illustrated in FIGS. 3 and 4. The lower lock rod 304 is configured to extend into a hole and/or recess in a frame (or in a bracket secured to the frame) to which the door 106 is mounted when the door 106 is closed and the lower lock rod 304 is extended into a lower position, so as to secure the door 106 against the frame in a similar manner as the upper lock rod 302 discussed above. The lower lock rod 304 is also positionable into an upper position where it does not extend beyond the lower extremity of the door 106. Positioning the lower lock rod 304 in this upper position facilitates the opening and closing of the door 106 against a frame, such as the frame 104. A detent member 710 is coupled to the lower lock rod 304 by a fastener 712 which allows detent member 710 to rotate about the axis of the fastener 712. The detent member 710 is coupled to an inside portion of the door 106 by a bracket 714, which is secured to the door 106 by fasteners 716. In some embodiments, the bracket 714 may be attached to the door 106 by other methods, such as by welding or by an adhesive such as epoxy. Although a bracket 714 including a pair of slots and holes for two fasteners is illustrated in FIGS. 7 and 8, in alternate embodiments, other brackets or securing mechanisms may be used, such as a bracket with more or fewer holes for fasteners and/or slots or other structures for guiding and/or retaining detent member 710, for example, pins or guide rods. In some embodiments bracket 714 may be eliminated entirely.

The detent member 710 is not limited to the shape illustrated. In alternate embodiments the detent member may be formed from a rod of material, or may be thinner, thicker, longer, or shorter than the detent member 710 as illustrated.

The detent member may also be coupled to a lock rod by other mechanisms, for example, by a cable or a push rod.

It should be noted that the present disclose is not limited to the use of rigid lock rods. In some embodiments a pin or other retaining device coupled to one or more cabinet doors may be moved by a cable mechanically coupled to a handle. The cable would push and/or pull the pin or other retaining device into and/or out from a recess or hole in the cabinet to lock or unlock the cabinet doors. In other embodiments a portion of the upper and/or lower lock rods 302, 304 may be replaced by a cable. In further embodiments, a cable may be used to mechanically couple the lock rods 302, 304 to a handle.

In embodiments where the door 108 is mounted to the electronics cabinet 102 with a vertical space between an upper edge thereof and an upper portion of a frame of the cabinet, a detent member and associated guide bracket and fasteners similar in form and function to those illustrated in FIGS. 7 and 8 may be attached to the upper lock rod 302. Also, the description below of the operation of the detent member 710 and its interaction with door 108 and the associated brackets, mounting plates, and other hardware would apply equally well to an embodiment where a detent member is provided on an upper lock rod rather than a lower lock rod.

FIGS. 9-13 illustrate an embodiment of fasteners 912 which may be used to rotatably attach the upper lock rod 302 and the lower lock rod 304 to the center lock rod mounting bracket 508. The fasteners 912 may also rotatably attach the lower lock rod 304 to the detent member 710. In the embodiment illustrated in FIGS. 9-13, the fasteners 912 may comprise bolt-like members which pass through holes in the upper lock rod 302 and the center lock rod mounting bracket 508, through holes in the lower lock rod 304 and the center lock rod mounting bracket 508, and through holes in the lower lock rod 304 and the detent member 710. The fasteners may be held in place by cotter pins (not designated) through holes in the bolt-like members. In other embodiments, alternate fasteners besides fasteners 912 may be utilized, such as bolts, screws, nuts, locknuts and/or lockwashers, or other appropriate fasteners.

Figure 14:
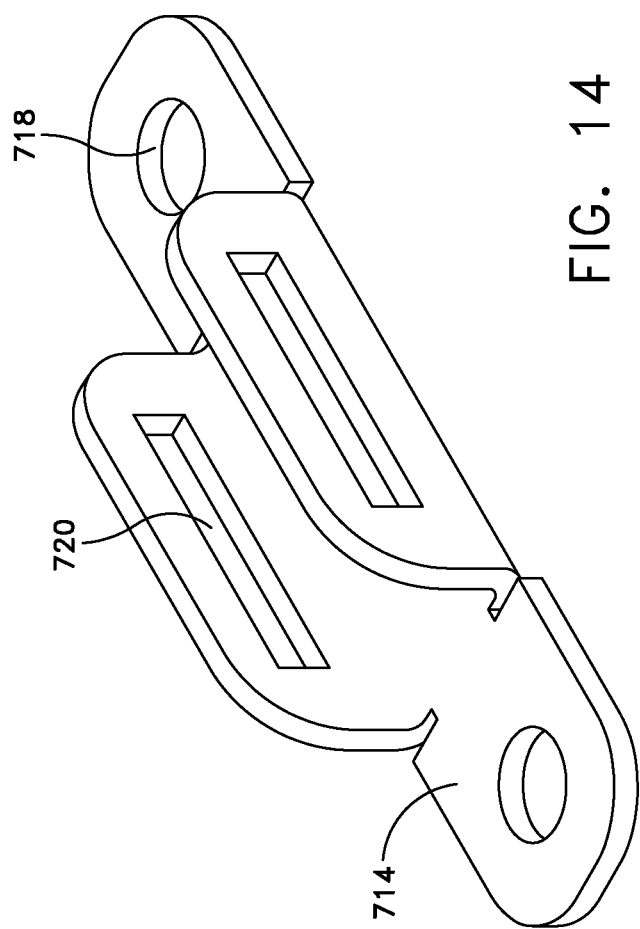
FIG. 14 is a perspective view of the bracket shown in FIG. 7.
Figure 15:
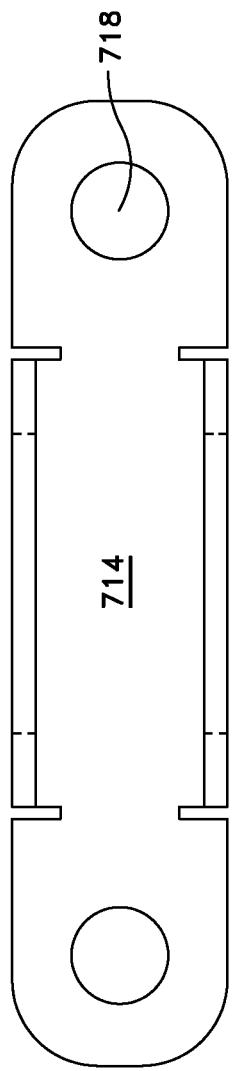
FIG. 15 is a top plan view of the bracket shown in FIG. 7.
Figure 16:
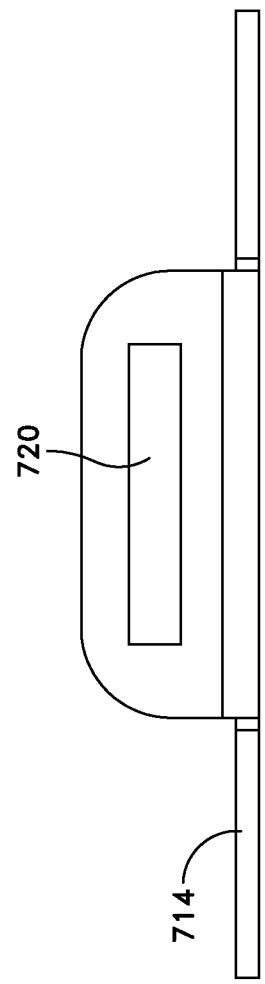
FIG. 16 is a side view of the bracket shown in FIG. 7.

FIGS. 14-16 illustrate enlarged views of the bracket 714 of the latch assembly comprising lock rod assembly 110, mounting brackets 308, 708 and detent member 710. This bracket 714 includes a pair of mounting holes 718 defined in a generally planar base portion, and a pair of slots 720 defined in a pair of generally planar side portions. In some embodiments, the side portions and the base portion are formed from a single piece of material. The side portions are illustrated in FIGS. 14-16 as perpendicular to the base portion, but in alternate embodiments may be disposed at an angle relative to the base portion. In some embodiments, there may be only a single side portion. In other embodiments, there may be two or more side portions of different sizes and/or shapes. Also, in some embodiments, slots 720 and/or mounting holes 718 may have different shapes from those illustrated. For example, in some embodiments the slot or slots 720 may be configured as generally circular holes. This circular shape for the slots 720 would be appropriate for embodiments where the detent member 710 is in the form of a rod with a generally circular cross section. In some embodiments, holes 718 may be elongated or oval shaped. This would allow for more freedom for positioning the bracket 714 on a surface to which it is mounted. In further embodiments, such as those where the bracket 714 is attached to a door by welding or with an adhesive, the holes 718 may be eliminated.

Figure 17:
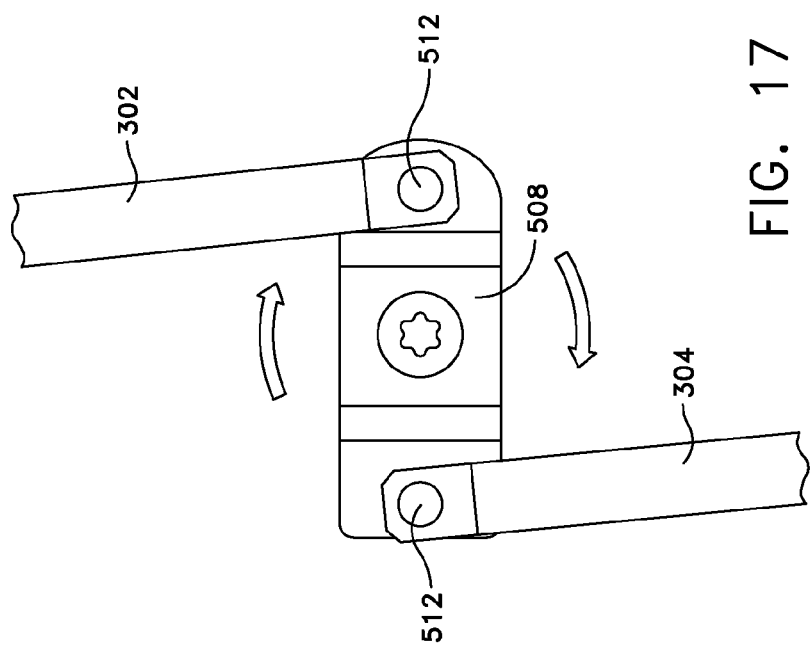
FIG. 17 is a front view of the center lock rod retaining bracket assembly in an open position.
Figure 18:
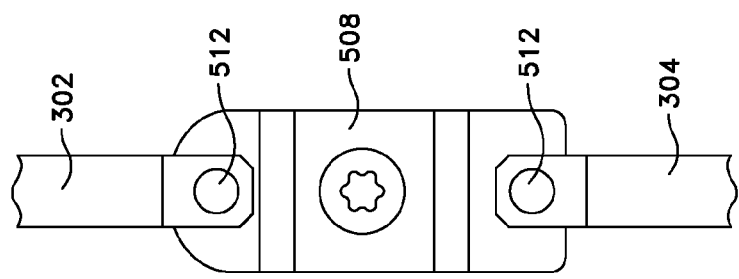
FIG. 18 is a front view of the center lock rod retaining bracket assembly in a locked position.

FIGS. 17 and 18 illustrate the operation of the center lock rod mounting bracket 508. FIG. 17 illustrates the center lock rod mounting bracket 508 in a generally horizontal position. This position may be attained by rotating a handle, such as the handle 200, to which the center lock rod mounting bracket 508 is coupled. In this position, the upper lock rod 302 is drawn downward from its upper vertical position and the lower lock rod 304 is drawn upward from its lower vertical position. In this position, neither of the lock rods 302, 304 would engage any recess or hole in the frame or in any bracket mounted to a frame to which the door to which they are attached is mounted. Thus, in this position the door would be unlocked and could be opened or closed. When the center lock rod mounting bracket 508 is in a generally vertical position, as shown in FIG. 18, the upper lock rod 302 is in an upper vertical position. The upper lock rod 302 assumes this position when a door to which it is attached is closed and locked. In this position, an upper end of the upper lock rod 302 would extend into a recess of a frame and/or a bracket mounted to a frame, such as frame 104, to which a closed door, such as door 106, is mounted. Similarly, FIG. 18 illustrates the lower lock rod 304 in a lower vertical position. In this position, a lower end of the lower lock rod 304 extends into a recess of a frame and/or a bracket mounted to a frame, such as frame 104, to which a closed door, such as door 106, is mounted. When the center lock rod mounting bracket 508 transitions between the locked position illustrated in FIG. 18 and the unlocked position illustrated in FIG. 17, or vice-versa, fasteners 512 (which in some embodiments may correspond to fasteners 912) allow the lock rods 302, 304 to rotate relative to the center lock rod mounting bracket 508 about the axes of fasteners 512.

Figure 19:
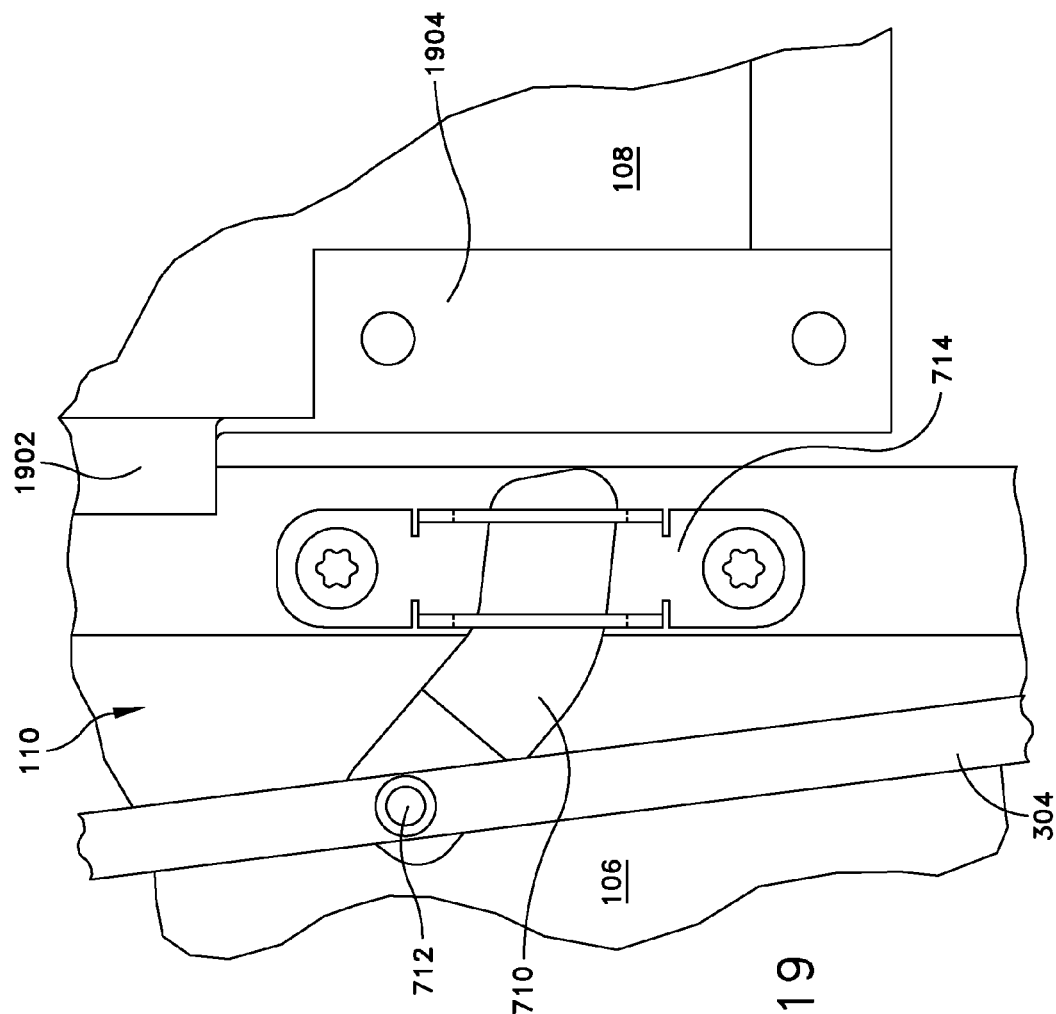
FIG. 19 is a front view of the lock rod, detent member, and door assembly in an unlocked position.
Figure 20:
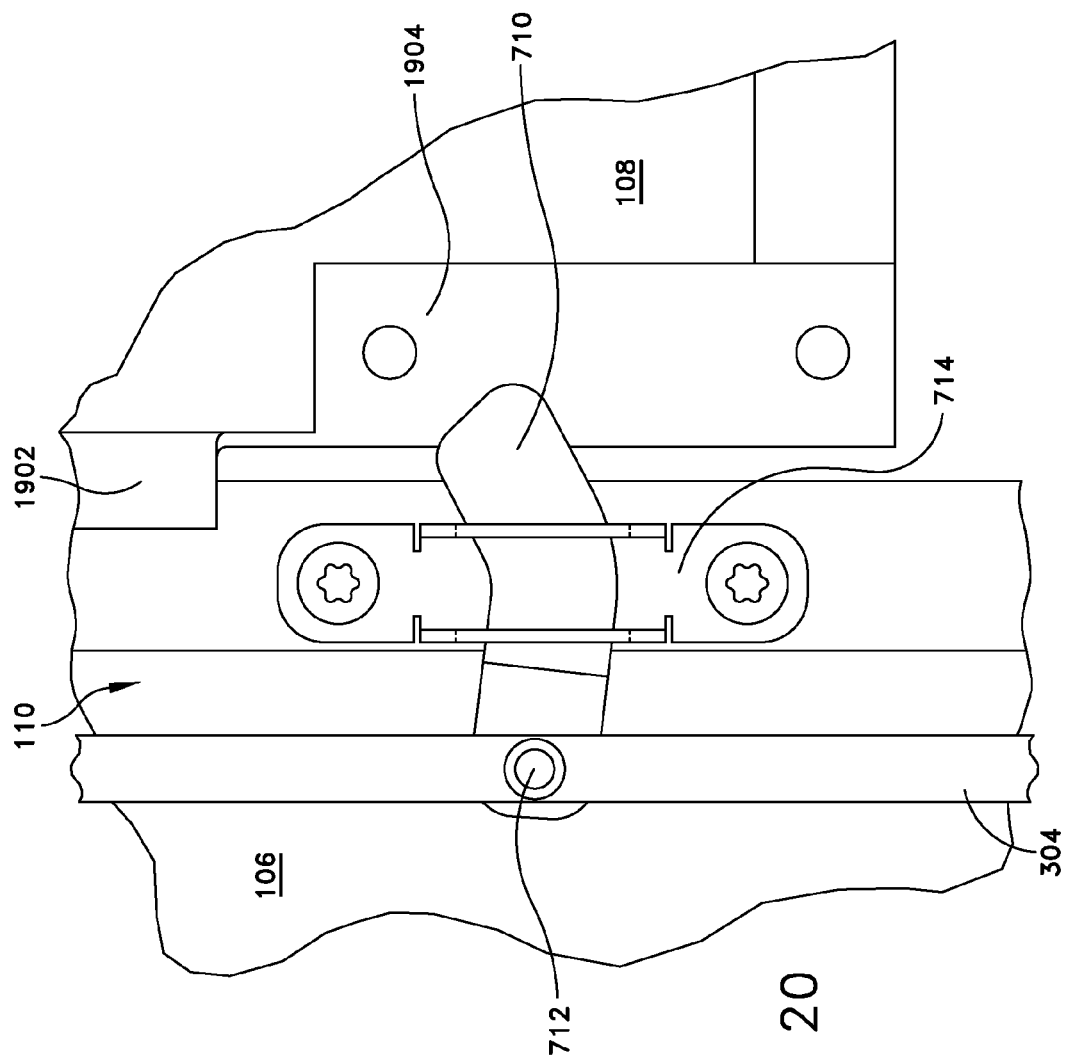
FIG. 20 is a front view of the lock rod, detent member, and door assembly in a locked position.
Figure 24:
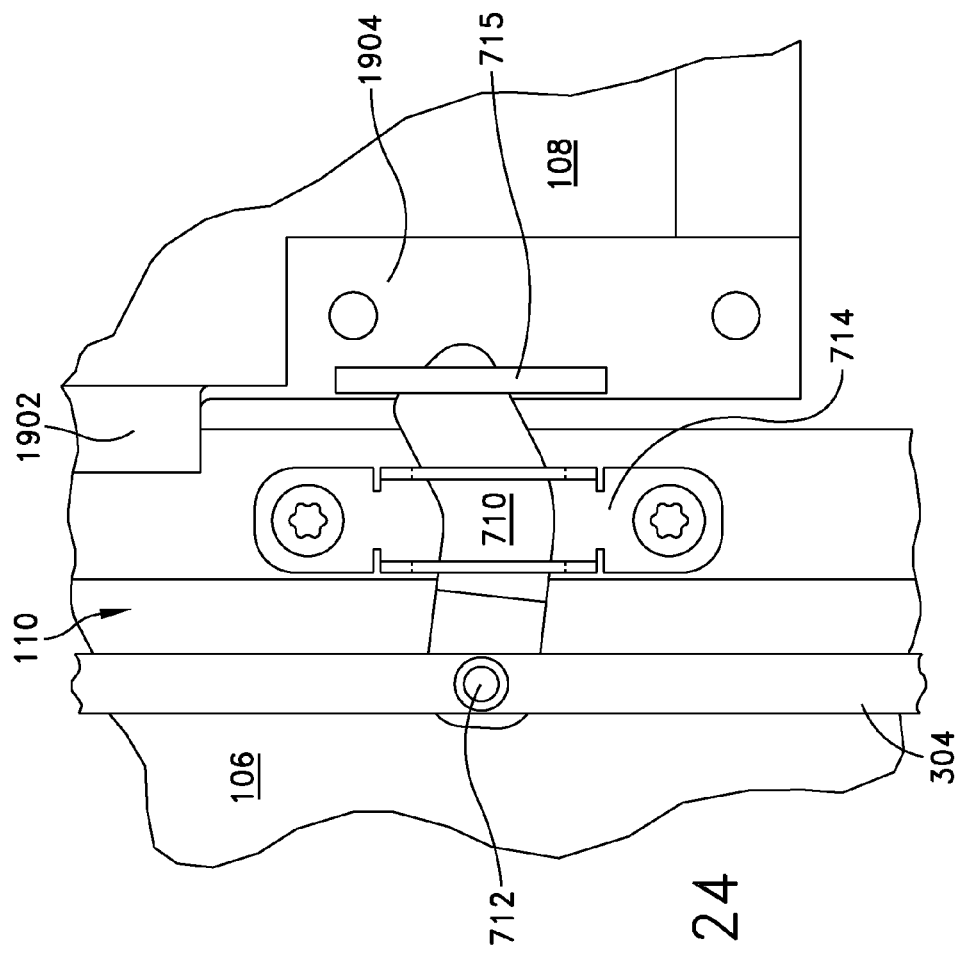
FIG. 24 is a front view of another embodiment of the lock rod, detent member, and door assembly in a locked position.

FIGS. 19 and 20 illustrate the operation of an embodiment of the detent member 710. FIG. 19 illustrates the configuration of the lower lock rod 304 and detent member 710 when the doors 106 and 108 are in an unlocked position and the center lock rod mounting bracket 508 is in the horizontal unlocked position illustrated in FIG. 17. The lower lock rod 304 is raised from its lower position. This is accomplished in some embodiments by the rotation of the center lock rod mounting bracket 508, but in some other embodiments, the lower lock rod 304 may be raised from its lower position by other means, for example by an electrically actuated solenoid or by the rotation of a gear which rotates in response to actuation of a handle and to which the lock rod is coupled. In this position, the lower lock rod 304 is free from engagement with the door frame 104 (not shown) to which the doors are mounted, thus placing the door 106 in an unlocked state. The door 108 is held close against the frame until the door 106 is opened because the door 106 in its closed position continues to restrain the flange 1902 attached to the door 108. Due to the position of the lower lock rod 304, the detent member 710 is pulled into an unlocked position free from engagement against a plate 1904 secured to an inner surface of the door 108. The plate 1904 is secured to the door 108 proximate an end of the door 108 which does not abut the frame 104 when closed. In other embodiments, when positioned in an unlocked state, the detent member 710 is pulled free from a bracket 715 (see FIG. 24), slot, or other engagement mechanism which may be present in or attached to the inside portion of the door 108 proximate an end of the door 108 which does not abut the frame 104 when closed. The lower end of the door 108 which does not abut the door frame 104 is capable of being moved or bent inward toward the frame and the inside of the cabinet when in the unlocked state.

FIG. 20 illustrates the configuration of the lower lock rod 304 and detent member 710 when the doors 106, 108 are in a locked position and center lock rod mounting bracket 508 is in the vertical locked position illustrated in FIG. 18. The lower lock rod 304 is in a lower position, engaging a recess in the frame 104 and/or a bracket secured to the frame 104 (not shown) to which the doors are mounted, thus locking the door 106 in place. The door 108 is also held closed against the frame because the door 106 restrains the flange 1902 attached to door 108, preventing the door 108 from opening. Due to the position of the lower lock rod 304, the detent member 710 is pushed into a locked position against the surface of the plate 1904 attached to the inner surface of the door 108, thereby preventing the lower end of door 108 (which does not abut the door frame) from moving inward toward the frame and the inside of the cabinet. In some embodiments, the detent member 710 frictionally engages the plate 1904 when the detent member 710 is extended, as illustrated in FIG. 20. In other embodiments, a space exists between the detent member 710 and the plate 1904 when the detent member 710 is extended. In some embodiments plate 1904 may be omitted. In other embodiments, a bracket 715 (see FIG. 24) may be mounted on the inside surface of door 108 to receive and/or retain the detent member 710 when in an extended state. In other embodiments, a slot may be formed in door 108 to receive and/or retain the detent member 710 when in an extended state.

Figure 21:
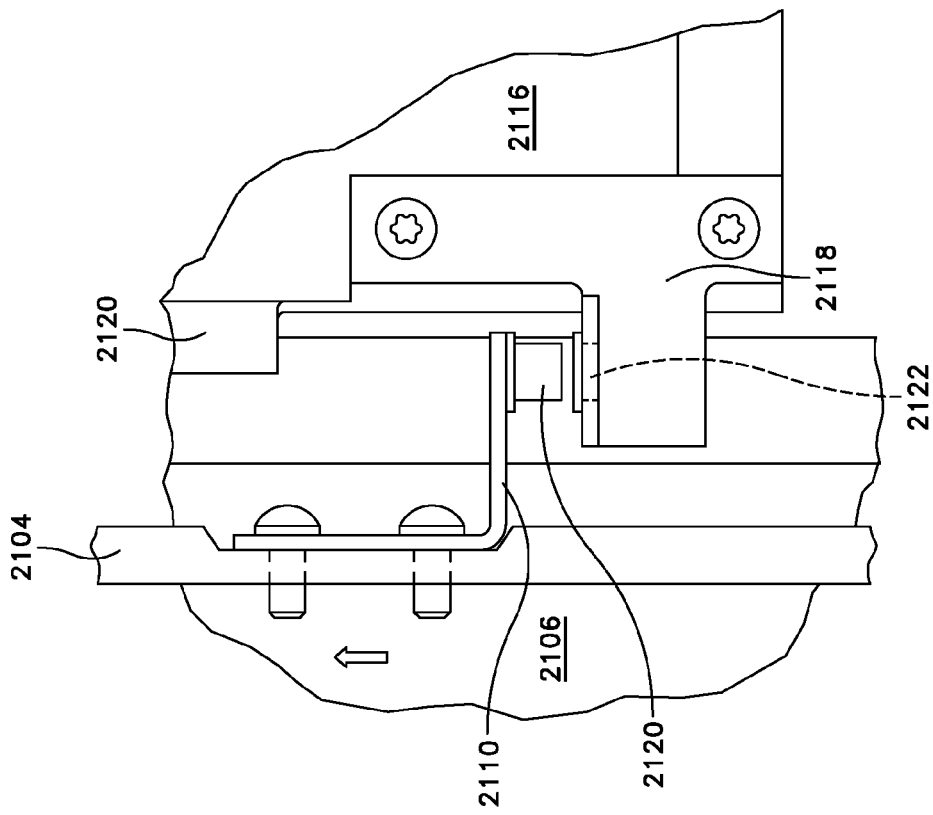
FIG. 21 is a side view of a lock rod, detent member, and door assembly in a locked position according to another embodiment of the present disclosure.
Figure 22:
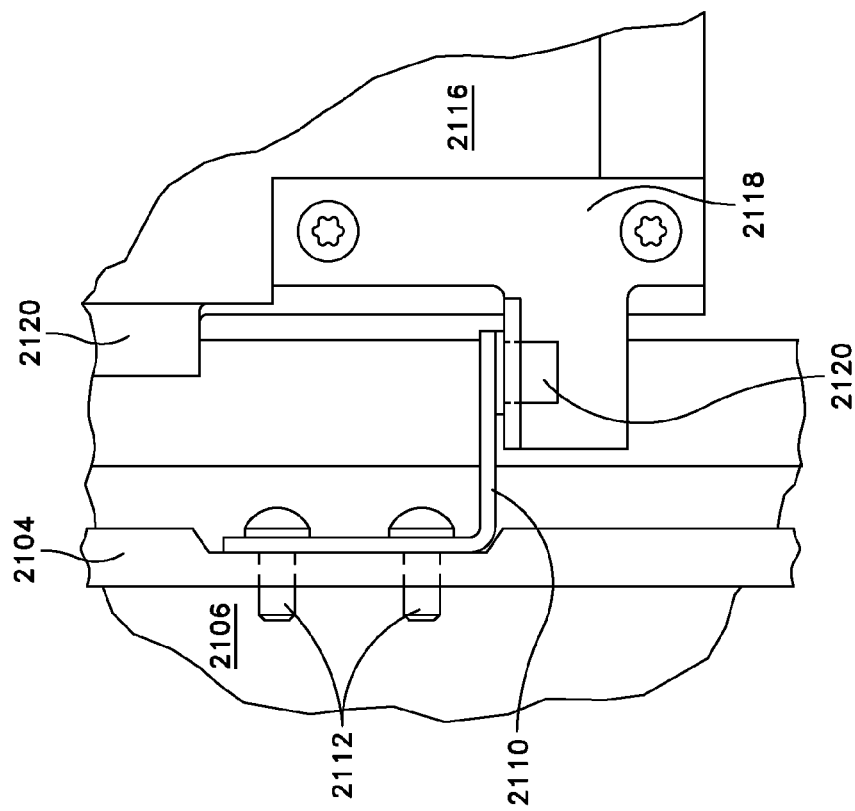
FIG. 22 is a side view of the lock rod, detent member, and door assembly shown in FIG. 21 in an open position.

FIGS. 21 and 22 illustrate another embodiment of a detent member 2110. In this embodiment, the detent member 2110 includes a first portion, which is secured by fasteners 2112 to a lower lock rod 2104, which in turn is coupled to a door 2106. The detent member 2110 has a second portion attached to the first portion and disposed roughly perpendicular to the first portion. In some embodiments, the first and the second portion are formed from a single piece of material. The second portion includes a protrusion 2120 on a lower surface thereof. In use, when the door 2106 and complimentary door 2116 are closed, the door 2116 is held against a door frame (not shown) by the door 2106 trapping a flange 2120 attached to the door 2116. As shown, a lower portion of the door 2116 is spaced from a lower portion of the door frame. When the lower lock rod 2104 is lowered, by rotation of a handle to which it is coupled, the protrusion 2120 of the detent member 2110 enters a hole 2122 defined in a bracket 2118, which is attached to the inner surface of door 2116, as shown in FIG. 21. Hole 2122 may in other embodiments be replaced by a recess in the bracket 2118. The insertion of protrusion 2120 into hole 2122 prevents movement of the lower portion of door 2116 inward or outward from an electronics cabinet (not shown) to which it is mounted. The lower portion of door 2116 is also prevented from moving outward due to flange 2120 and bracket 2118 being in contact with an inner edge of door 2106. In other embodiments, a space may be present between bracket 2118 and door 2106. When the lower lock rod is raised as in FIG. 22, the protrusion 2120 no longer engages the bracket 2118 and the lower portion of the door 2116 is no longer prevented by the detent member 2110 from being forced inward into the electronics cabinet. In alternate embodiments the detent member 2110 may have a size and/or shape different from that illustrated. For example, in some embodiments the first and the second portions of the detent member 2110 are disposed at an angle relative to one another, rather than roughly perpendicular to one another as illustrated in FIGS. 21 and 22.

It should also be noted that in some embodiments the lock rods may move from a lower position in which they are substantially vertically oriented to an upper position in which they are oriented at an angle, as is illustrated in FIGS. 19 and 20. In other embodiments the lock rods are substantially vertically oriented in both an upper and a lower position, as is illustrated in FIGS. 21 and 22.

In some embodiments an actuator, such as an electrical solenoid, may installed and coupled to the latch assembly to facilitate actuation of the latch assembly from outside the cabinet. The actuator may be energized in response to an output from a card key, a fingerprint sensor, a numerical keypad, or other input device located on the outside of the cabinet. The input device may also be located remote from the cabinet and communicate with the actuator through a communications network. In some embodiments, the handle may be lockable and unlockable with a key. In other embodiments, the handle may be electrically lockable and/or unlockable by an actuator such as an electrical solenoid, which may be activated in a similar manner as the latch assembly actuator.

Another embodiment of the present disclosure comprises a retrofit kit configured to provide the components used to replace a "long" door of an electronics cabinet with a "short" door. This retrofit kit may be utilized to modify and/or replace one or more doors of an electronics cabinet, which do not provide for a vertical and/or horizontal space between the one or more doors and a frame of the cabinet. The retrofit kit may include one or more doors with a height and/or a width less than that of the frame of the electronics cabinet to which it or they are to be attached. The retrofit kit may also include a latch assembly. The latch assembly may include a lock rod assembly, such as lock rod assembly 110. The lock rod assembly may have one or more lock rods, such as the upper and lower lock rods 302 and 304. In some embodiments, the lock rods may be constructed and arranged to be substantially horizontally mounted within the cabinet, and in other embodiments, substantially vertically oriented. The latch assembly may include a center lock rod mounting bracket, such as the center lock rod mounting bracket 508 and fasteners which may be utilized to couple the one or more lock rods to the center lock rod mounting bracket. The latch assembly may also include a detent member, such as detent member 710 and/or 2110, as well as the associated hardware, which may be utilized to attach the latch assembly to the one or more doors. This hardware may include brackets, such as the brackets 308, and/or 708, and/or 714, and/or 2118, as well as bushings, such as the bushing 312, and fasteners, such as the fasteners 310, and/or 510, and/or 512, and/or 712, and/or 716, and/or 912, and/or 2112. The retrofit kit may also include a handle, such as the handle 200. In addition, the retrofit kit may include instructions for installing the retrofit kit.

In another embodiment of the present disclosure, there is provided a method for replacing one or more doors of an electronics cabinet. Some embodiments of this method include utilization of a retrofit kit as described above. Embodiments of the method will be described with reference to FIG. 23. In step 2302 of FIG. 23, the existing doors of an electronics cabinet are removed. If the cabinet does not have previously installed doors, this step may be skipped. In some embodiments, an existing door with a height approximately co-extensive with a height of a frame (a "long" door) of the cabinet is removed.

In step 2304, a door with a height less than the height of the frame (a "short" door) of the cabinet is installed. In some embodiments, installation of the short door may include attaching the short door to a frame of the cabinet or to walls of the cabinet with hinges. This step may include drilling holes for the attachment of hinges in the cabinet or a frame of the cabinet or may involve welding the hinges to the cabinet or welding or otherwise attaching plates or a frame comprising hinge attachment surfaces to the cabinet. In different embodiments, the short door may be installed such that a vertical space is left between the bottom of the short door and the bottom of the frame of the cabinet, between the top of the short door and the top of the frame of the cabinet, or both. The short door may be similar to the door 108 described above. In one embodiment, a plate such as plate 1904 may be attached to an inner surface of the short door before or after installation. In another embodiment, a bracket for receiving a detent member, such as the bracket 2118 described above, may be attached to an inner surface of the short door before or after installation. In a further embodiment, the short door has neither a plate nor a bracket attached to its inner surface. In some embodiments, the short door may include a slot for receiving a detent member. The short door may in some embodiments be provided along with other parts as part of a retrofit kit, or in other embodiments may be constructed by modifying a door previously installed on the cabinet by, for example, shortening the pre-existing door by cutting a portion of the door away and/or by attaching a bracket or plate to the door, and/or by cutting a slot in the door.

In step 2306, a latch assembly is installed on a long door. The long door in some embodiments has a height substantially co-extensive with a height of the cabinet or a height of the frame of the cabinet. The long door may in some embodiments be a door that was previously installed on the cabinet. In other embodiments the long door may be supplied along with other parts as part of a retrofit kit. The latch assembly may include a lock rod assembly, such as lock rod assembly 110. The lock rod assembly may have one or more lock rods, such as upper and lower lock rods 302 and 304. The latch assembly may include a center lock rod mounting bracket, such as the center lock rod mounting bracket 508 and fasteners which may be utilized to couple the one or more lock rods to the center lock rod mounting bracket. The latch assembly may also include a detent member, such as the detent member 710 and/or 2110, as well as hardware, which may be utilized to attach the latch assembly to the door. This hardware may include brackets, such as the brackets 308, and/or 708, and/or 714, and/or 2118, as well as bushings, such as the bushing 312, and fasteners, such as the fasteners 310, and/or 510, and/or 512, and/or 712, and/or 716, and/or 912, and/or 2112. If a suitable latch assembly including upper and lower lock rods is present on a long door that was previously installed on the cabinet, that long door and latch assembly may be re-used but modified to include a detent member, a detent member guide, for example, a bracket, and appropriate fasteners. A handle, such as handle 200, may also be installed on an outside surface of the long door and coupled to the latch assembly to facilitate actuation of the latch assembly from outside the cabinet. In some embodiments an actuator, such as an electrical solenoid, may installed and coupled to the latch assembly to facilitate actuation of the latch assembly from outside the cabinet. The actuator may be energized in response to an output from a card key, a fingerprint sensor, a numerical keypad or other input device located on the outside of the cabinet. The input device may also be located remote from the cabinet and communicate with the actuator through a communications network. In some embodiments, the handle may be locked and unlocked with a key. In other embodiments, the handle may be electrically locked and/or unlocked by an actuator, such as an electrical solenoid.

In step 2308, the long door is installed on the cabinet. In some embodiments, installation of the long door may include attaching the long door to a frame of the cabinet or to walls of the cabinet with hinges. In some embodiments, installation of the long door may include forming hole(s) and/or recess(es) in a portion or portions of the cabinet frame and/or cabinet walls(s) to accommodate portions of the one or more lock rods included in the latch assembly to facilitate locking of the cabinet doors. In some embodiments, these recesses and/or holes may be formed in brackets that may be attached to portions of the frame and/or cabinet walls.

Figure 23:
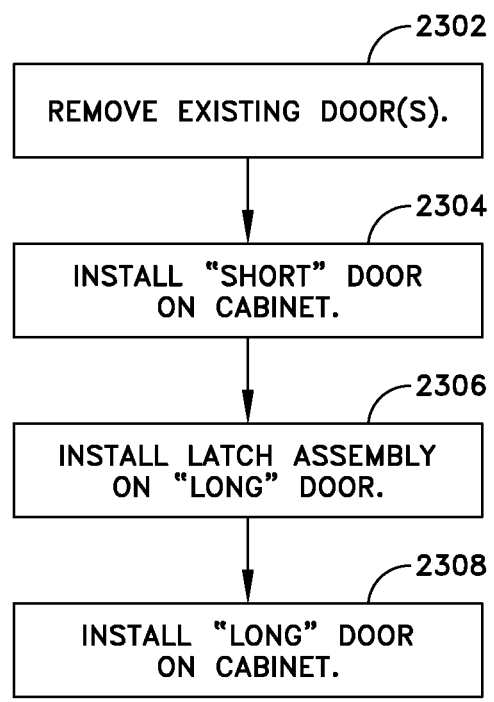
FIG. 23 is a flow chart of a method according to an embodiment of the present disclosure.

The order of steps in the method of FIG. 23 is not meant to be limiting. In other embodiments, these steps may be performed in alternate orders. In some embodiments additional steps may be included in the method. In other embodiments one or more of the steps described may be eliminated or substituted.

Other embodiments of this method, with appropriate modifications, would apply to replacing one or more doors of electronics cabinets having only a single door or to cabinets having a door or doors, which open and close by rotating about a horizontal axis.

Various embodiments and methods described herein address the design challenge of replacing a standard length door with a short door while being able to adequately secure a side (or sides) of the short door to a frame of the equipment rack. The installation of a short door on an electronics cabinet provides a space through which electrical cables may be routed. The provision of a detent member as described above facilitates prevention of movement of an end of a short door which does not abut a frame of the cabinet. In some embodiments, the detent member facilitates preventing or limiting the extent to which an end of the short door may be pushed or bent inward into the inside of the cabinet. In other embodiments, the detent member facilitates preventing or limiting the extent to which an end of the short door may be pushed or bent inward or outward from the cabinet. In some embodiments, a detent member may limit the potential for deformation of a short door, thus both limiting the potential for damage and the cost for replacing or repairing the door. The detent member may also enhance the security of the cabinet by facilitating securing a door in place thus limiting access to electronic components within the cabinet.

Having thus described several aspects of at least one embodiment of this disclosure, it is to be appreciated various alterations, modifications, and improvements will readily occur to those skilled in the art. Such alterations, modifications, and improvements are intended to be part of this disclosure, and are intended to be within the spirit and scope of the disclosure. Accordingly, the foregoing description and drawings are by way of example only.

What is claimed is:

1. A retrofit kit for replacing a first door of an electronics cabinet, the retrofit kit comprising:
   a latch assembly including:
      one or more lock rods, each of the one or more lock rods including a shaft portion;
      a center lock rod mounting bracket;
      a fastener constructed and arranged to couple at least one of the one or more lock rods to the center lock rod mounting bracket;
      a detent member constructed and arranged to rotatably attach to the shaft portion of one of the one or more lock rods;
      one or more brackets constructed and arranged to secure the latch assembly to a second door of the electronics cabinet; and
      one or more bushings constructed and arranged couple to the one or more brackets and to guide the one or more lock rods;
   a handle constructed and arranged to couple to the shaft portion of the one or more lock rods;
   a replacement door having a vertical length shorter than a vertical length of the first door, a frame member of the electronics cabinet and one of an upper edge of the replacement door and a bottom edge of the replacement door defining a gap, the gap having a size sufficient for a passage of electrical cables through the gap when all doors of the electronics cabinet are closed; and a retaining bracket configured to be secured to an inside surface of one of the replacement door and the second door and to retain the detent member.

2. The retrofit kit of claim 1, further comprising instructions for installing the retrofit kit.

3. The retrofit kit of claim 1, wherein the detent member is constructed and arranged to rotatably attach directly to the shaft portion of one of the one or more lock rods.

4. A method of replacing a first door of an electronics cabinet, the method comprising:

removing the first door from the electronics cabinet;

attaching a replacement door having a height less than a height of a frame of the electronics cabinet to the frame of the electronics cabinet, the replacement door having a vertical length shorter than a vertical length of the first door, the frame of the electronics cabinet and one of an upper edge of the replacement door and a bottom edge of the replacement door defining a gap, the gap having a size sufficient for a passage of electrical cables through the gap when all doors of the electronics cabinet are closed; and installing a latch assembly on a second door of the electronics cabinet, the latch assembly including one or more lock rods and a detent member rotatably disposed on a shaft portion of one of the one or more lock rods, the detent member configured to selectively engage a bracket secured to an inside surface of the replacement door.

5. The method of claim 4, further comprising forming a recess in the frame of the electronics cabinet, the recess arranged to receive a portion of one of the one or more lock rods.

6. The method of claim 4, further comprising attaching the bracket to the replacement door, the bracket constructed and arranged to receive a portion of the detent member.

7. The method of claim 4, further comprising attaching the second door to the frame of the electronics cabinet, the second door having a height substantially co-extensive with a height of the frame of the electronics cabinet.

8. The method of claim 4, further comprising installing a handle on the second door, the handle coupled to the shaft portion of the one or more lock rods.

9. The method of claim 4, further comprising attaching a detent member guide to the second door.

10. The method of claim 4, further comprising attaching the second door to the frame of the cabinet.

11. A method of replacing a first door of an electronics cabinet, the method comprising:

removing the first door from the electronics cabinet;

attaching a replacement door having a height less than a height of a frame of the electronics cabinet to the frame of the electronics cabinet, the replacement door having a vertical length shorter than a vertical length of the first door, the frame of the electronics cabinet and one of an upper edge of the replacement door and a bottom edge of the replacement door defining a gap, the gap having a size sufficient for a passage of electrical cables through the gap when all doors of the electronics cabinet are closed; and installing a latch assembly on a second door of the electronics cabinet, the latch assembly including one or more lock rods and a detent member rotatably disposed on a shaft portion of one of the one or more lock rods, the detent member configured to selectively engage a bracket secured to an inside surface of the second door.

12. The method of claim 11, further comprising forming a recess in the frame of the electronics cabinet, the recess arranged to receive a portion of one of the one or more lock rods.

13. The method of claim 11, further comprising attaching the bracket to the second door, the bracket constructed and arranged to receive a portion of the detent member.

14. The method of claim 11, further comprising attaching the second door to the frame of the electronics cabinet, the second door having a height substantially co-extensive with a height of the frame of the electronics cabinet.

15. The method of claim 11, further comprising installing a handle on the second door, the handle coupled to the shaft portion of the one of the one or more lock rods.

16. The method of claim 11, further comprising attaching a detent member guide to the second door.

17. The method of claim 11, further comprising attaching the second door to the frame of the cabinet.

* * * * *